(12) United States Patent
van Ginkel

(10) Patent No.: US 10,298,099 B2
(45) Date of Patent: May 21, 2019

(54) METHOD OF SENSOR MISALIGNMENT LEARNING FOR MOTOR SPEED ESTIMATION

(71) Applicant: Dana Automotive Systems Group, LLC, Maumee, OH (US)

(72) Inventor: Johannes van Ginkel, Melden (BE)

(73) Assignee: Dana Automotive Systems Group, LLC, Maumee, OH (US)

( * ) Notice: Subject to any disclaimer, the term of this patent is extended or adjusted under 35 U.S.C. 154(b) by 0 days.

(21) Appl. No.: 15/444,660

(22) Filed: Feb. 28, 2017

(65) Prior Publication Data
US 2018/0248450 A1 Aug. 30, 2018

Related U.S. Application Data

(60) Provisional application No. 62/301,566, filed on Feb. 29, 2016.

(51) Int. Cl.
*H02K 11/215* (2016.01)
*G01R 1/00* (2006.01)
*H02P 6/17* (2016.01)

(52) U.S. Cl.
CPC ......... *H02K 11/215* (2016.01); *G01R 1/00* (2013.01); *H02P 6/17* (2016.02)

(58) Field of Classification Search
CPC .................................................. H02K 11/215
USPC ........................................... 318/490, 400.38
See application file for complete search history.

(56) References Cited

U.S. PATENT DOCUMENTS

| | | | | |
|---|---|---|---|---|
| 4,600,866 A * | 7/1986 | Seto | ............... | H02P 23/16 388/809 |
| 4,667,297 A * | 5/1987 | Kawai | ............... | G01P 3/489 324/160 |
| 6,081,087 A * | 6/2000 | Iijima | ............... | H02P 6/16 318/400.13 |
| 6,100,823 A * | 8/2000 | Copper | ............... | G01D 5/2455 341/11 |
| 7,005,812 B2* | 2/2006 | Mitchell | ............... | H02P 6/16 318/400.04 |
| 7,190,145 B2* | 3/2007 | Grand | ............... | H02P 6/15 318/400.13 |
| 7,423,396 B2* | 9/2008 | Bolt | ............... | H02P 6/16 318/400.34 |
| 7,486,041 B2* | 2/2009 | Wasson | ............... | G04C 3/143 318/432 |
| 7,808,200 B2* | 10/2010 | Liu | ............... | H02P 29/032 318/400.21 |
| 8,058,826 B2* | 11/2011 | Mock | ............... | H02P 6/14 318/139 |
| 9,525,372 B2* | 12/2016 | Hill | ............... | H02P 6/186 |
| 9,915,709 B2* | 3/2018 | Liu | ............... | G01R 33/07 |

(Continued)

*Primary Examiner* — Jorge L Carrasquillo
(74) *Attorney, Agent, or Firm* — Marshall & Melhorn, LLC

(57) ABSTRACT

A method of estimating electric motor speed. The method determines whether a sequential cycle of the electric motor has occurred. The method calculates a correction factor for each of the Hall states. Where a sequential cycle of the electric motor has occurred, the method also calculates an update quality factor for the correction factors of the sequential cycle. The method updates the correction factors utilizing the update quality factor. Utilizing the updated correction factors, the method updates the electric motor speed signal.

20 Claims, 8 Drawing Sheets

(56) References Cited

U.S. PATENT DOCUMENTS

| | | | |
|---|---|---|---|
| 2005/0152489 A1* | 7/2005 | Morita, Jr. | H02P 6/16 377/6 |
| 2007/0028689 A1* | 2/2007 | Vrcelj | G01P 15/11 73/514.17 |
| 2007/0194743 A1* | 8/2007 | Grand | H02P 6/15 318/721 |
| 2010/0223025 A1* | 9/2010 | Holzmann | G01P 3/481 702/148 |
| 2011/0043158 A1* | 2/2011 | Yuasa | B60N 2/0232 318/599 |
| 2015/0061547 A1* | 3/2015 | Gougani | H02P 5/526 318/85 |
| 2015/0137718 A1* | 5/2015 | Liu | G01R 23/00 318/400.03 |
| 2016/0327409 A1* | 11/2016 | Bouallaga | G01D 5/145 |

\* cited by examiner

METHOD OF SENSOR MISALIGNMENT LEARNING FOR MOTOR SPEED ESTIMATION

CROSS-REFERENCE TO RELATED APPLICATIONS

This application claims the benefit of U.S. Provisional Patent Application No. 62/301,566 filed on Feb. 29, 2016, which is herein incorporated by reference in its entirety.

BACKGROUND

The present disclosure relates to motor speed estimation. Brushless direct current (BLDC) motors, and electric motors in general, are often controlled by using several cascaded closed-loop controllers. One of the loops controls the motor speed and compares the speed setpoint with the actual speed of the electric motor. Because the actual speed of the electric motor is not measured directly, the actual speed of the electric motor may be estimated utilizing information such as the motor position. The subject matter disclosed herein describes a method of estimating electric motor speed from Hall-effect sensor information and accounting for misalignments in the Hall-effect sensor parts and ring magnet irregularities.

A conventional BLDC motor typically includes a stator having electromagnetic poles with windings thereon, and a rotor comprising permanent magnets creating permanent magnetic pole pairs. The stator and the rotor magnetically interact with each other when electric current flows in the stator windings. Phase commutation of current flowing through each of the stator windings is performed at a proper time to form a continuously rotating magnetic field, which can be achieved as a rotor position is correctly recognized.

BLDC motors most commonly utilize a three-phase configuration with Hall-effect sensors imbedded in the motor to define commutation positions for each phase. A conventional three-phase BLDC motor includes a rotor having a plurality of magnetic poles; typically two to eight pole pairs. As illustrated in FIG. 1, a three-phase BLDC motor has six states of commutation (also referred to herein as Hall states). When all six states in the commutation sequence have been performed the sequence is repeated to continue the rotation. The number of ring magnet pole pairs determines the number of electrical revolutions per mechanical revolution. For example, a BLDC having a rotor with two pole pairs requires two electrical revolutions to spin the motor once; in other words, two electrical revolutions produce one mechanical revolution.

Hall-effect sensors in BLDC motors are typically used for rotor ring magnet pole position sensing and to commutate the motor based on the change of the Hall-effect sensor signals. In other words, the Hall-effect sensors are utilized to control current in the stator windings, and thereby control BLDC motor torque. Hall-effect sensors are utilized because they are cost effective position sensors.

Conventional BLDC motors have three Hall-effect sensors embedded into the stator on the non-driving end of the motor. When the rotor magnetic poles pass near the Hall-effect sensors, the Hall-effect sensors give a high or low signal (i.e., pulse) indicating a N or S magnetic pole is passing near the Hall-effect sensors. Based on the combination of three Hall-effect sensors, the exact sequence of commutation can be determined. A Hall state is defined by a predetermined position, or by a continuous set of predetermined positions, of a rotor relative to one or more Hall-effect sensors.

In typical BLDC motor operations, two of the three phases of a BLDC motor conduct current while the third phase has zero current (i.e., a dead phase) in order for the motor to rotate. A conventional three-phase BLDC motor uses Hall-effect sensors, where each Hall state indicates which two of the three phases are active (i.e., not dead). Hall states can be used to create a one-to-one relation with rotor phases and the direction which the voltage needs to be applied. There are six possible Hall phase combinations which cover exactly one electrical revolution; therefore, the position resolution using the three phase Hall-effect sensors is limited to one sixth of an electrical revolution.

A conventional method of estimating motor speed is based on complete Hall-effect pulses and includes triggering on the rising edge of a Hall-effect signal, and dividing the corresponding number of mechanical degrees by the duration of the last Hall period (i.e., the period between a first pulse and a second pulse). However, as illustrated in FIG. 4, information gathered through the conventional method is delayed over a complete electrical revolution of the motor. It is therefore desirable to obtain a speed estimation with a faster response through a different method.

As illustrated in FIG. 4, the method described herein estimates motor speed with a faster response by looking at the duration of each individual Hall state. This speed estimate technique may introduce more noise to the estimated motor speed. Therefore, the present method reduces the effect of noise in the estimated motor speed by learning the motor characteristics. The present method reduces the noise in the BLDC motor speed estimate without introducing the additional delay produced by conventional averaging methods.

SUMMARY

The present disclosure provides for a method of estimating electric motor speed. The method determines whether a sequential cycle of the electric motor has occurred. The method calculates a correction factor for each of the Hall states. Where a sequential cycle of the electric motor has occurred, the method also calculates an update quality factor for the set of correction factors for the sequential cycle. Additionally, the method updates the correction factors utilizing the update quality factor. With the updated correction factors, the method updates the electric motor speed signal.

BRIEF DESCRIPTION OF THE SEVERAL VIEWS OF THE DRAWINGS

The accompanying drawings are incorporated herein as part of the specification. The drawings described herein illustrate embodiments of the presently disclosed subject matter, and are illustrative of selected principles and teachings of the present disclosure. However, the drawings do not illustrate all possible implementations of the presently disclosed subject matter, and are not intended to limit the scope of the present disclosure in any way.

DETAILED DESCRIPTION OF EMBODIMENTS

Figure 1:
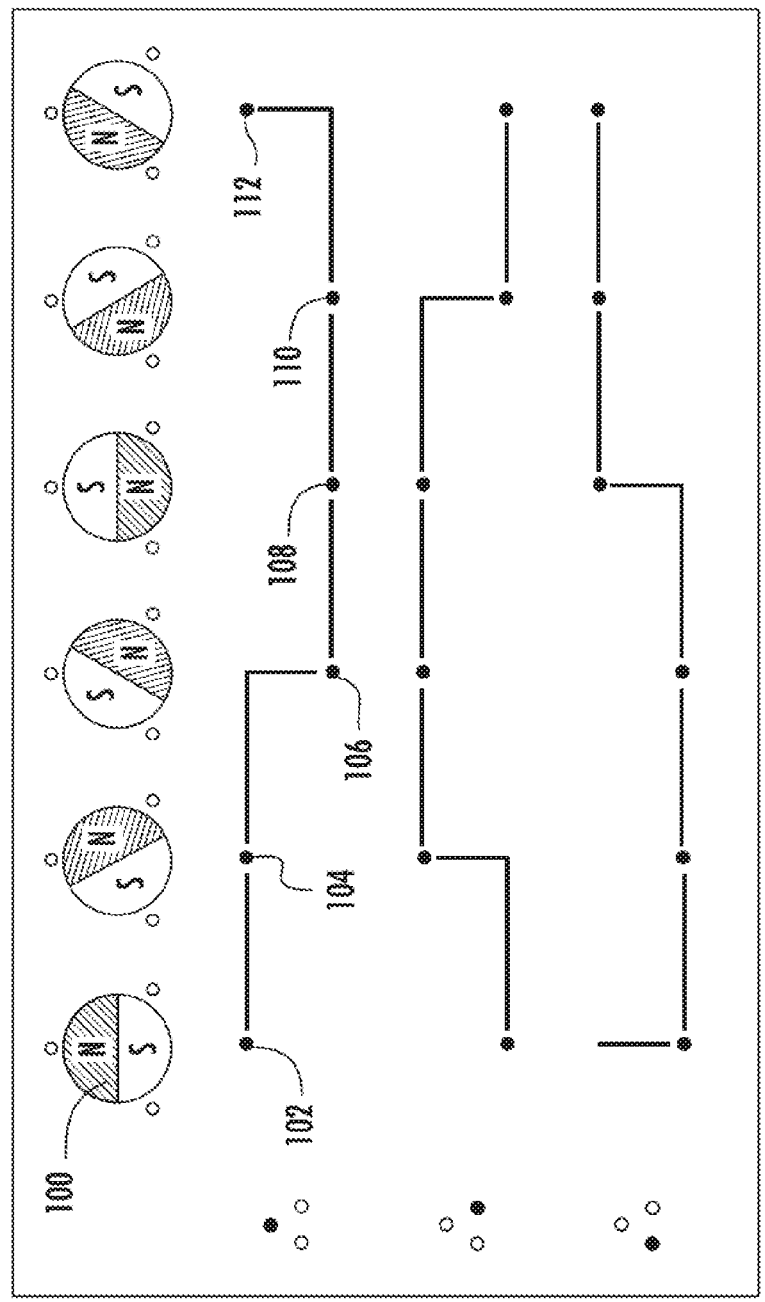
FIG. 1 is a schematic diagram of Hall-effect signals during one electrical revolution according to an embodiment of the presently disclosed subject matter.

It is to be understood that the invention may assume various alternative orientations and step sequences, except where expressly specified to the contrary. It is also to be understood that the specific devices, assemblies, systems and processes illustrated in the attached drawings, and described in the following specification are simply exemplary embodiments of the inventive concepts defined herein. Hence, specific dimensions, directions or other physical characteristics relating to the embodiments disclosed are not to be considered as limiting, unless expressly stated otherwise. Also, although they may not be, like elements in various embodiments described herein may be commonly referred to with like reference numerals within this section of the application.

BLDC motors are utilized in applications across many industries including automotive, aerospace, consumer, medical, industrial automation equipment, and instrumentation applications. The subject matter disclosed herein may be utilized in the operation of all-wheel drive vehicle connect/disconnect systems. However, persons having skill in the relevant arts will recognize that the subject matter disclosed herein may be applied to any application utilizing electric motors and Hall-effect sensors.

Figure 2:
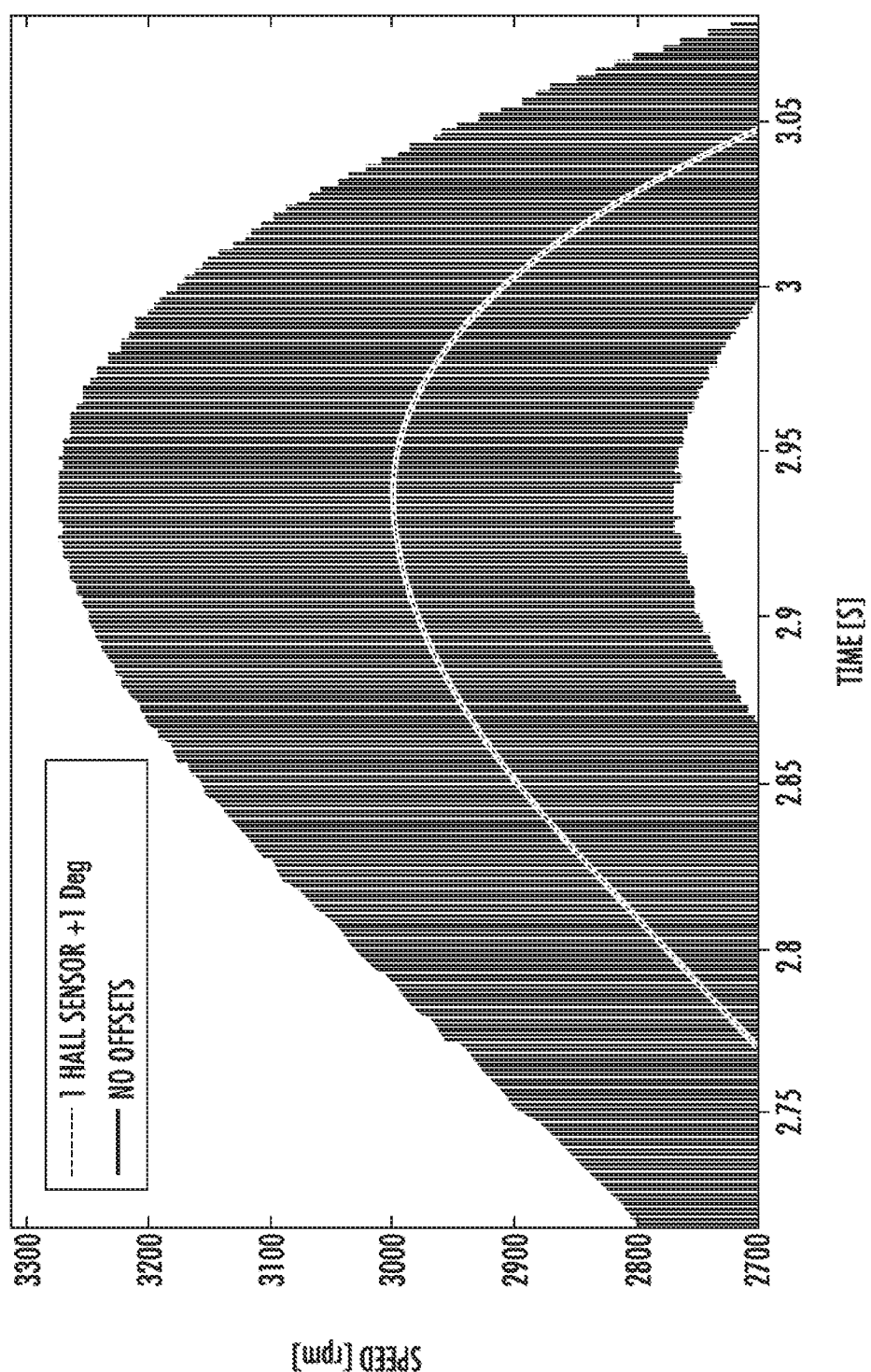
FIG. 2 is a graphic representation of a Hall-effect sensor misalignment as a possible source of noise in a speed signal according to an embodiment of the presently disclosed subject matter.
Figure 3:
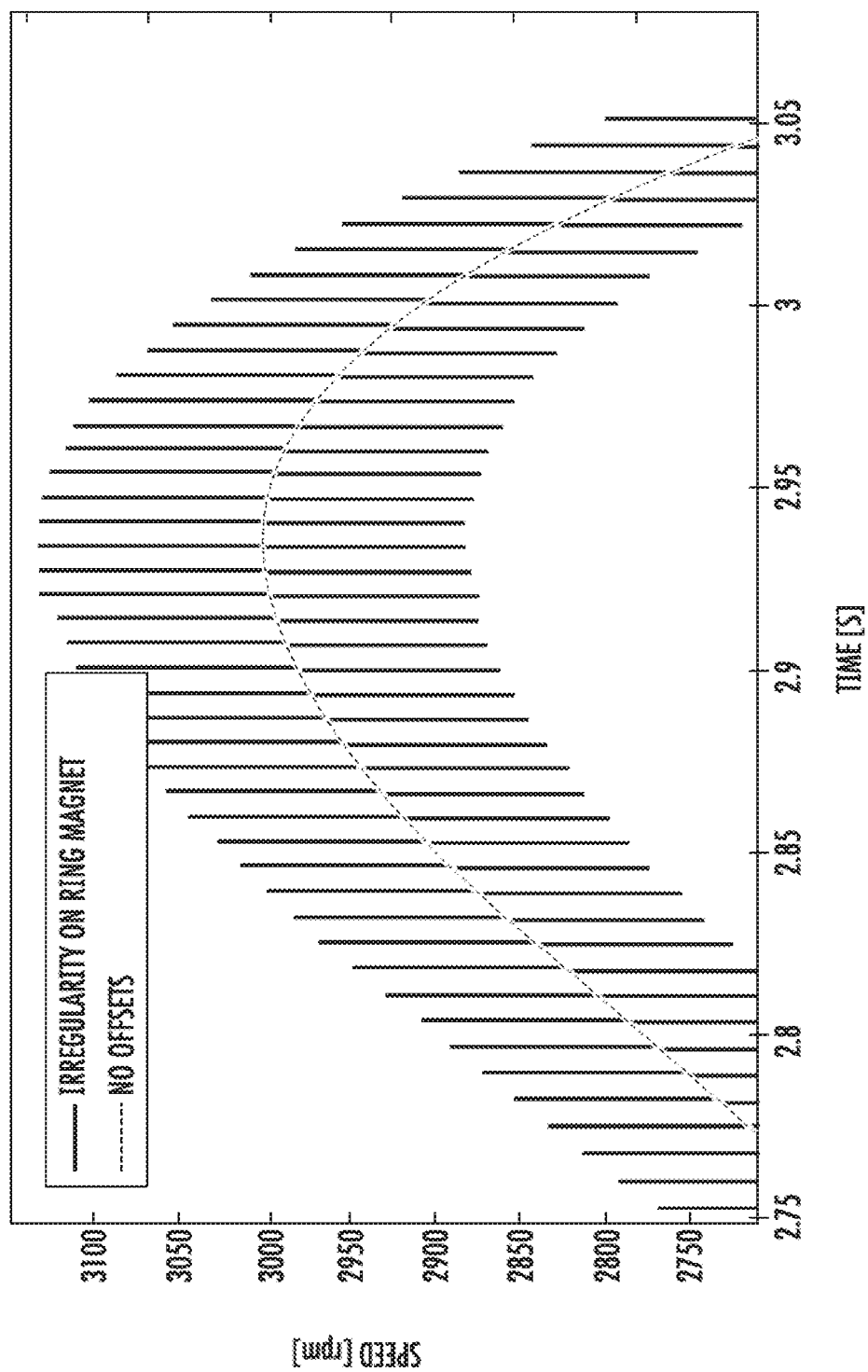
FIG. 3 is a graphic representation of a ring magnet irregularity as a possible source of noise in a speed signal according to an embodiment of the presently disclosed subject matter.
Figure 4:
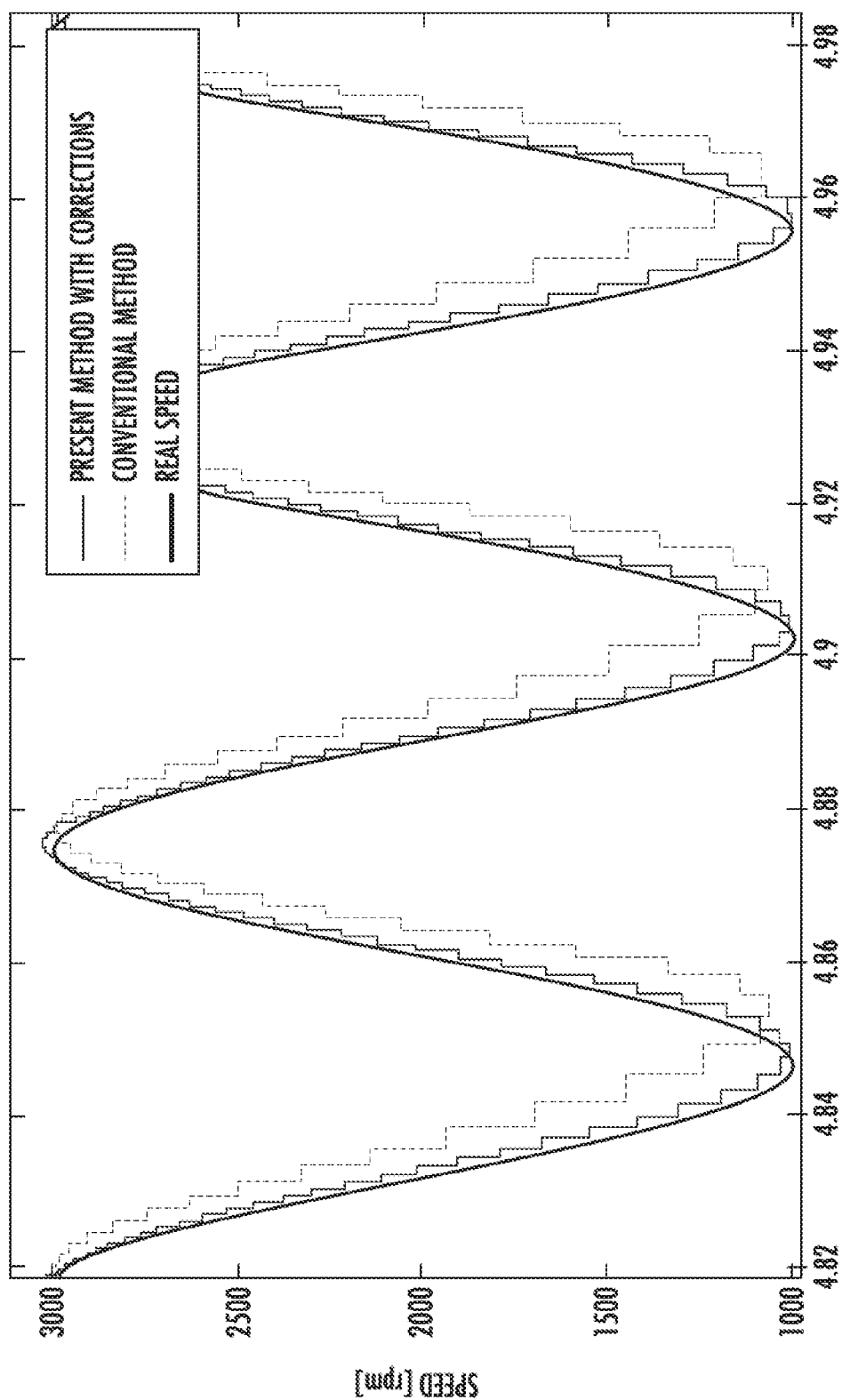
FIG. 4 is a graphic representation of time delay results utilizing a conventional method of Hall-effect sensor motor speed estimation as compared with the method of Hall-effect sensor misalignment learning for motor speed estimation according to an embodiment of the presently disclosed subject matter.
Figure 5:
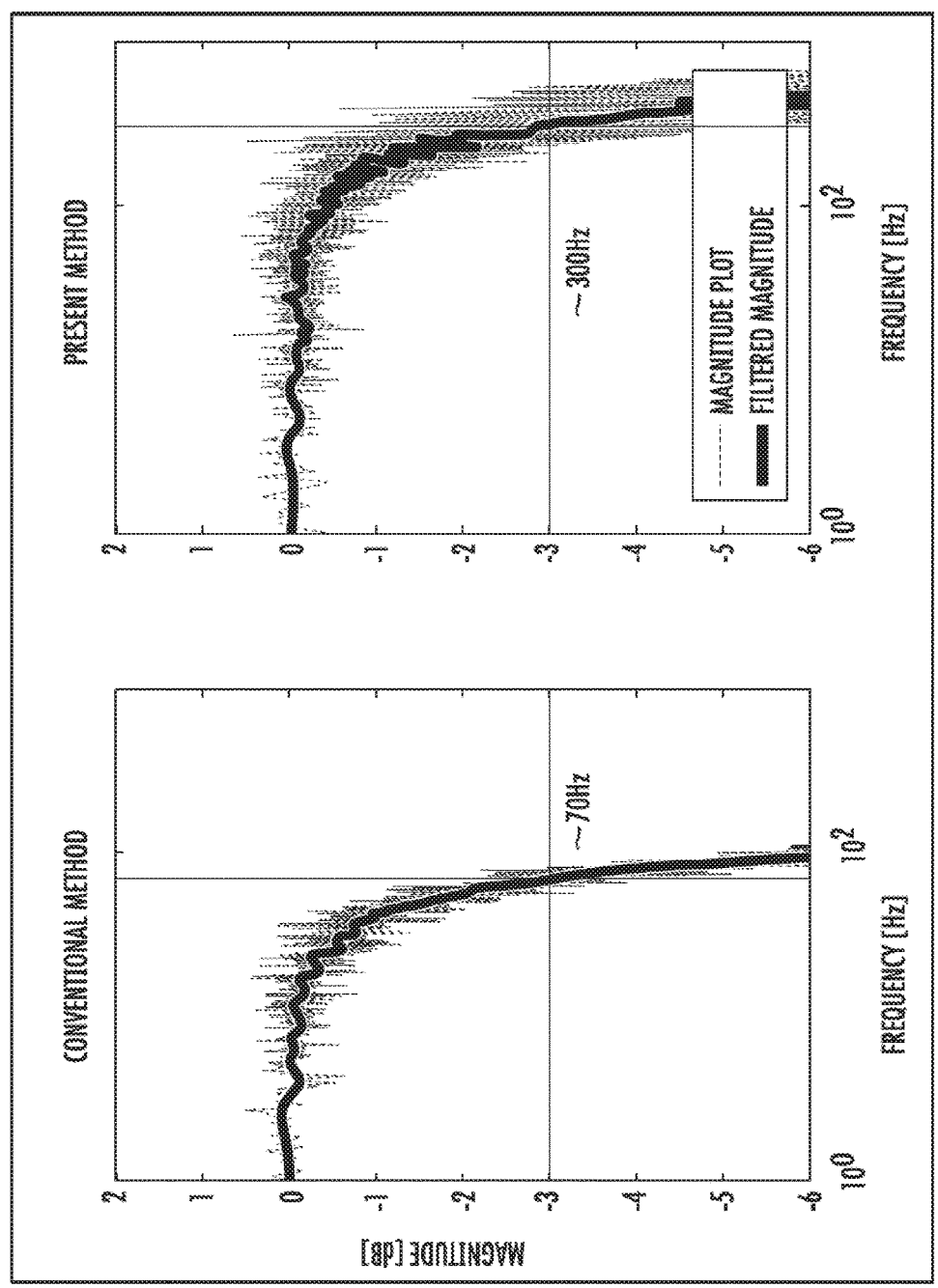
FIG. 5 is a graphic representation of frequency domain results utilizing the conventional method of Hall-effect sensor motor speed estimation as compared with a present method of Hall-effect sensor misalignment learning for motor speed estimation of the presently disclosed subject matter.

In an embodiment, the present method 200, 300 updates a BLDC motor speed signal when any one of a plurality of Hall-effect sensors changes state. As illustrated in FIGS. 2 and 3, utilizing the present method 200, 300 may produce noise in the signal created by Hall-effect sensor offsets and ring magnet irregularities. Therefore, in order to minimize the effects of the noise in the signal, the method 200, 300 compares individual Hall state time periods to the time period of a full sequential cycle. A full sequential cycle is an electrical revolution when performing Hall-effect sensor offset correction as in the method 200, and a mechanical revolution when performing ring magnet irregularity correction as in the method 300. The first step 204, 304 of the method determines whether a full sequential cycle has occurred. If it is determined that a full sequential cycle has not occurred 204A, the method 200, 300 calculates the electric motor speed in a fifth step 212, 312 (described intra) utilizing correction factors calculated in the previous full sequential cycle. If it is determined that a full sequential cycle has occurred 204B, the method 200, 300 continues to the second step 206, 306 described intra. The method 200, 300 may be an iterative process where the method is restarted at the first step 204, 304 after the motor speed is calculated in the fifth step 212, 312.

Figure 7:
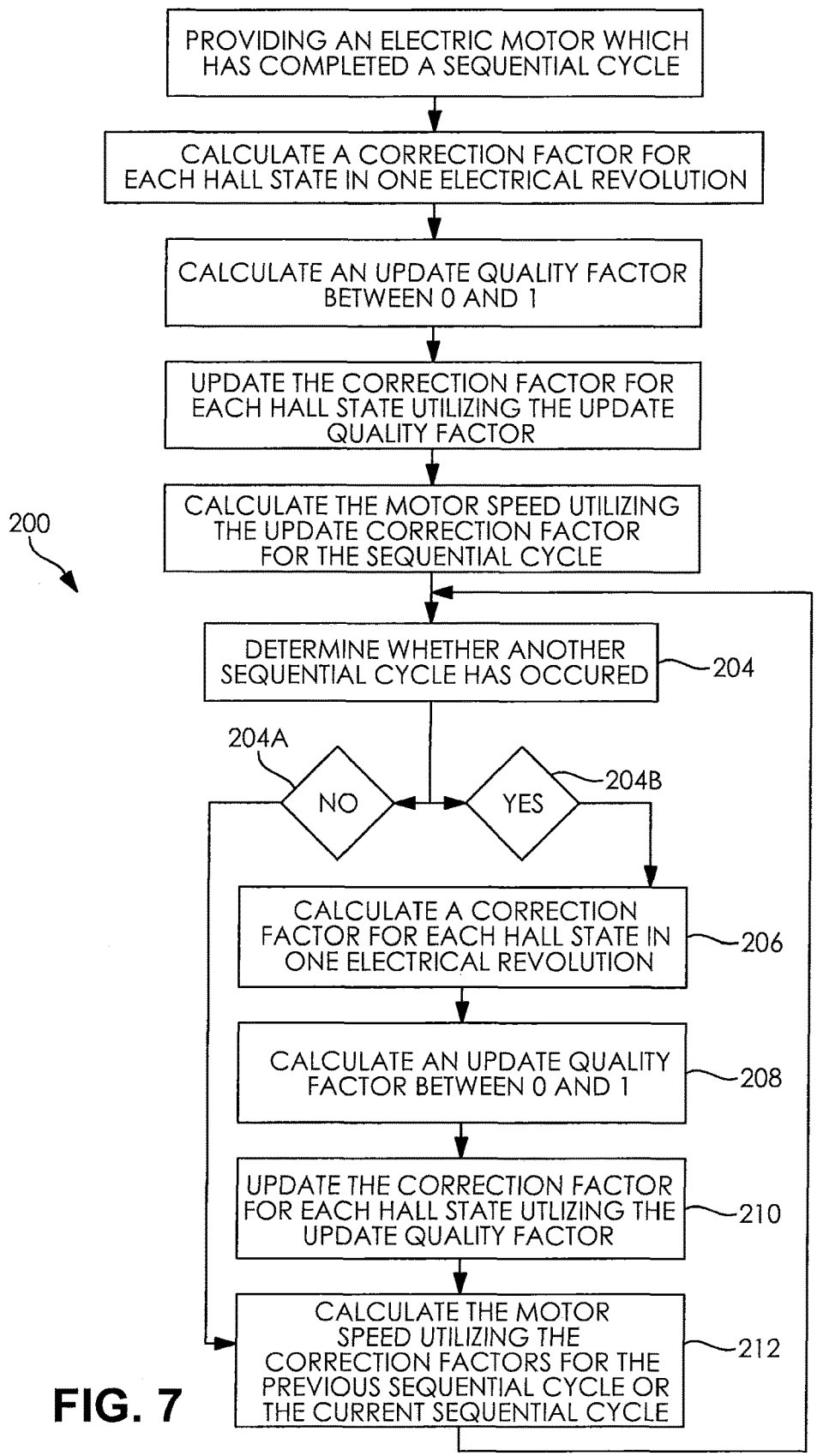
FIG. 7 is a flow chart illustrating the method of Hall-effect sensor motor speed estimation according to an embodiment of the presently disclosed subject matter.
Figure 8:
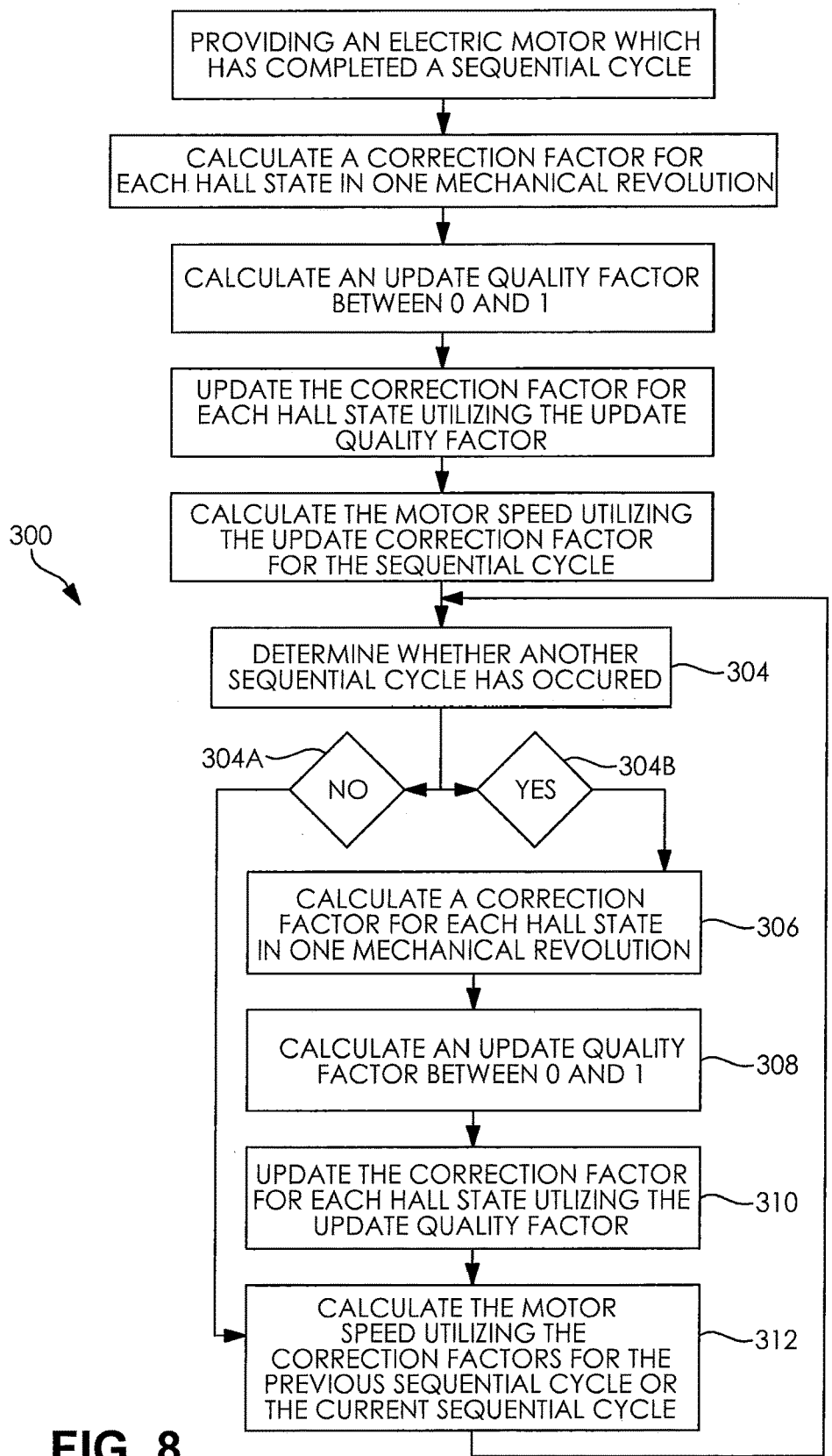
FIG. 8 is a flow chart illustrating the method of Hall-effect sensor motor speed estimation according to another embodiment of the presently disclosed subject matter.

As illustrated in FIGS. 7 and 8, the second step 206, 306 of the method 200, 300 includes calculating new correction factors. In the case of Hall-effect sensor offset correction as in the method 200 (see FIG. 7), there is one correction factor for each Hall state. In an example where there is a combination of three Hall-effect sensors, there will be n=6 correction factors. In the method 300, in an example having a combination of three Hall-effect sensors, ring magnet irregularity is also corrected for (see FIG. 8). In the method 300 there are n=6*p correction factors, where p is the number of poles on the ring magnet. Referring now to FIG. 1, a ring magnet 100 having one pole pair (i.e., two poles) is depicted in each of the six Hall states; each Hall state change indicated by a point 102, 104, 106, 108, 110, 112.

Figure 6:
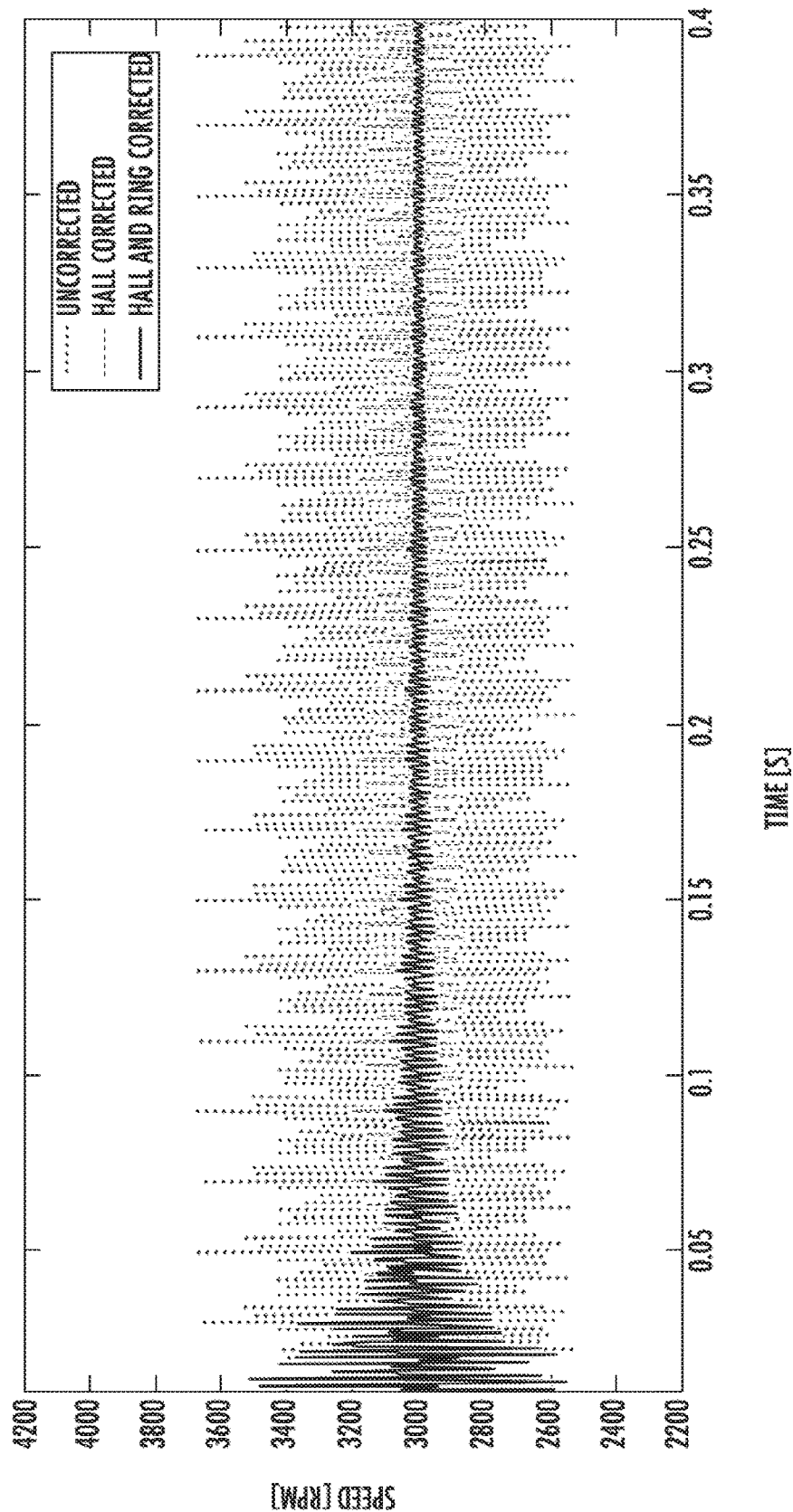
FIG. 6 is a graphic representation of speed signal noise reduction results utilizing the second implementation of the method of Hall-effect sensor misalignment learning for motor speed estimation, comparing uncorrected results, Hall-effect sensor misalignment corrected results, and Hall-effect sensor misalignment and ring magnet irregularity corrected results.

Referring now to the method 200, directed to Hall-effect sensor offset correction, as illustrated in FIGS. 6 and 7, new correction factors can be calculated when a complete electrical revolution has occurred, such that the direction of the motor did not change for a complete electrical revolution, regardless of the initial Hall state. If the BLDC motor is moving such that the Hall states are proceeding in the same direction (e.g., |1 2 3 4 5 6|1 2 3 4 5 6|), such that the BLDC motor completes an electrical revolution in one direction, the method will proceed to calculate new correction factors. In other words, the method will proceed to the second step 206, 306 of calculating new correction factors after each Hall state change 102, 104, 106, 108, 110, 112 where the previous electrical revolution was moving in a single direction regardless of the initial Hall state. For example, the following sequences depict a complete electrical revolution (i.e., six Hall states) in one direction, and illustrate that the initial Hall state is irrelevant; the six Hall states in one electrical revolution moving in a single direction are indicated in bold font: 1|2 3 4 5 6 1|2 3 4 5 6; |2 1 3 4 5 6|2 1 3 4 5 6; |2 3|4 5 6 1 2 3|4 5 6; etcetera. The BLDC motor speed is calculated after each Hall state change 102, 104, 106, 108, 110, 112, however the correction factor for a Hall state described in the second step 206, 306 can only be updated where the BLDC motor was moving in a single direction for the last complete sequential cycle.

As described supra with respect to t, if a full sequential cycle has not occurred, the third 208, 308 and fourth 210, 310 steps of the method 200, 300, described below, are skipped and the method 200, 300 calculates the motor speed utilizing the correction vector of a previous sequential cycle (see the sixth step 212, 312).

A correction factor $c_i$ for each Hall state i can be calculated utilizing:

$$c_i = \frac{n \cdot t_i}{t_{cycle}}$$

Where $\eta$ is the number of correction factors, $t_i$ is the time spent in one Hall state, and $t_{cycle}$ is the time spent in a full sequential cycle. In the case of Hall-effect sensor correction only, there are three Hall-effect sensor offsets and six correction factors. The resulting correction factors do not directly describe the physical Hall-effect sensor offsets. The physical Hall-effect sensor offsets may be derived from the correction factors, but the derivation of the Hall-effect sensor offsets is not discussed further herein. However, as described intra, the relationship between the correction factors and the physical Hall-effect sensor offsets can be utilized to assess the quality of a new set of correction factors from a full sequential cycle.

The third step 208, 308 of the method 200, 300 includes calculating an update quality factor to determine the quality of a current set of correction factors from a full sequential cycle, and capturing the information concerning quality in a value between 0 and 1. The quality of the current correction factors is dependent, in part, on the effects of acceleration during the full sequential cycle from the correction factors were calculated. Therefore, where the velocity remains nearly constant, the method obtains an accurate estimate of the Hall-effect sensor offsets and ring magnet irregularities; and where the velocity increases, the effects of acceleration distort the estimations of the Hall-effect sensor offsets and ring magnet irregularities. Because an electrical revolution is shorter than a mechanical revolution, the likelihood of obtaining favorable conditions during Hall-effect sensor correction is higher than obtaining favorable conditions during ring magnet irregularity correction.

Procedures for calculating a quality factor for a current set of Hall-effect sensor correction factors include, but are not limited to, the following three procedures. A first procedure includes checking whether the obtained correction vector (i.e., the set of correction factors for a sequential cycle) is physically feasible by comparing the obtained correction vector to the physical constraints of the Hall-effect sensor positions. In the first procedure, BLDC motor acceleration provides Hall-effect sensor signals indicating a position of the Hall-effect sensors different than their predetermined position. For example, if one of the Hall-effect sensors is offset by a certain factor, the influence on the six Hall states of a complete electrical revolution is in the form of $[1+\varepsilon, 1, 1-\varepsilon, 1+\varepsilon, 1, 1-\varepsilon]$.

A second procedure includes using external signals—such as the duty ratio for the motor—to provide a secondary source of information to determine the actual BLDC motor speed and detect acceleration. During commutation of the motor, the duty ratio controls the voltage in the commutation phases. A duty ratio of 0% indicates that the three-phase inverter switches are always closed, and a duty ratio of 100% indicates the three-phase inverter switches are always open. Setting a duty ratio between 0% and 100% means the electric motor commutation phases are controlled to the desired voltage, between zero and the maximum voltage, using a pulse-width modulation signal.

A third procedure of obtaining a quality factor for a Hall-effect sensor correction factor includes using the correction factors themselves to detect acceleration trends. If all of the preceding correction factors are clearly increasing or decreasing, the BLDC motor accelerated. In each procedure, the higher the level of acceleration, the lower the quality factor of that update will be. A predetermined value between 0 and 1 is assigned to a range of BLDC motor acceleration.

The fourth step 210, 310 of the method 200, 300 includes updating the correction factors utilizing the quality factor calculated in the third step 208, 308 of the method 200, 300. The vector of correction factors can be updated utilizing the quality factor, such that:

$$c_{updated} = \frac{c_{new} \cdot w_{new} + c_{old} \cdot w_{total}}{w_{new} + w_{total}}$$

Where $c_{updated}$=the updated correction vector, $c_{new}$=the new correction vector, $w_{new}$=the quality factor, $c_{old}$=the previously calculated correction vector from the last sequential cycle, and $w_{total}$=the sum of the previous quality factors. In the fourth step 210, 310, the correction factors may be updated utilizing other methods including, but not limited to, incorporating a form of a forgetting factor.

The fifth step 212, 312 of the method 200, 300 includes calculating the BLDC motor speed utilizing the updated correction factors, such that:

$$\dot{\omega} = \frac{c_i \cdot \alpha}{t_{prev}}$$

Where $\dot{\omega}$ is the motor speed in degrees per second (deg/sec), $c_i$ is the correction factor for the previous Hall state, $\alpha$ is the number of mechanical degrees per Hall state, and $t_{prev}$ is the time spent in the previous Hall state. The method 200, 300 may also include additional steps for the implementation of a minimum motor speed, a check for outlier values of $t_{prev}$ in case of direction reversal, and/or a comparison with the current timer to detect decelerations in a predictive way. For example, if the time spent in a first Hall state is 1 ms, and the motor is currently in a second Hall state, the method 200, 300 normally calculates motor speed utilizing the time the motor spent in the first Hall state. However, where it is apparent that the time spent in the second Hall state is longer than the duration of the first Hall state (i.e., 1 ms in this example), and the motor is not yet in a third Hall state, the method 200, 300 may calculate motor speed utilizing the second Hall state because it is apparent that the electric motor speed is decreasing.

The method 200, 300 may be implemented in a plurality of ways. In a first embodiment, the method 200, 300 is implemented under controlled conditions, such as in end of line testing, to map the characteristics of each individual BLDC motor. This implementation makes the assumption that Hall-effect sensor misalignments and ring magnet irregularities do not change over the life of the motor. However, in the case of ring magnet correction, the motor relearns the position of the ring magnet each time the motor is initialized.

In a second embodiment, the method 200, 300 is implemented online during operation of the system associated therewith (e.g., a vehicle). This second implementation may provide value in harsh environments where alignments inside the motor could change over the life of the motor.

While various embodiments of the presently disclosed subject matter have been described above, it should be understood that they have been presented by way of example, and not limitation. It will be apparent to persons skilled in the relevant arts that the disclosed subject matter may be embodied in other specific forms without departing from the spirit or essential characteristics thereof. The embodiments described above are therefore to be considered in all respects as illustrative, not restrictive.

What is claimed is:
1. A method for estimating electric motor speed, comprising:
providing an electric motor which has completed a first sequential cycle, said electric motor including:

a stator having at least one Hall-effect sensor coupled therewith, wherein said at least one Hall-effect sensor is configured to sense a plurality of Hall states of said electric motor, and wherein a correction factor for each of said Hall states of said first sequential cycle has been calculated; and a rotor having at least one magnetic pole pair;

determining whether a second sequential cycle of said electric motor has occurred;

calculating a correction factor for each of said Hall states of said second sequential cycle of said electric motor when said second sequential cycle of said electric motor has occurred via comparing a time duration of each of said Hall states of said second sequential cycle of said electric motor to a time duration of said second sequential cycle of said electric motor;

calculating an update quality factor for said second sequential cycle of said electric motor based upon said correction factors for said second sequential cycle of said electric motor when said second sequential cycle of said electric motor has occurred;

calculating an updated correction factor for each of said Hall states of said second sequential cycle of said electric motor when said second sequential cycle of said electric motor has occurred by utilizing said update quality factor for said second sequential cycle of said electric motor and said correction factors for said first sequential cycle of said electric motor; and calculating said electric motor speed utilizing said correction factors for said second sequential cycle of said electric motor, when said second sequential cycle of said electric motor has occurred.

2. The method for estimating electric motor speed according to claim 1, further comprising:

calculating said electric motor speed utilizing said updated correction factors from said first sequential cycle of said electric motor when said second sequential cycle of said electric motor has not occurred.

3. The method for estimating electric motor speed according to claim 1, wherein said second sequential cycle of said electric motor is one electrical revolution.

4. The method for estimating electric motor speed according to claim 1, wherein calculating said correction factor for one of said Hall states comprises:

determining a number of said Hall states in said second sequential cycle of said electric motor;

determining a time duration of said one of said Hall states of said electric motor;

determining said time duration of said second sequential cycle of said electric motor;

multiplying said number of said Hall states in said second sequential cycle of said electric motor by said time duration of said one of said Hall states to produce a first product; and dividing said first product by said time duration of said second sequential cycle of said electric motor.

5. The method for estimating electric motor speed according to claim 1, wherein calculating said update quality factor comprises:

comparing said correction factors of said second sequential cycle of said electric motor to at least one physical constraint of said at least one Hall-effect sensor to determine an offset factor of said correction factors; and determining a value for said update quality factor from said offset factor.

6. The method for estimating electric motor speed according to claim 1, wherein calculating said update quality factor comprises:

determining a plurality of speed values of said electric motor from a plurality of duty ratios for said electric motor;

determining an acceleration of said electric motor from said speed values of said electric motor; and determining a value for said update quality factor from said acceleration of said electric motor.

7. The method for estimating electric motor speed according to claim 1, wherein calculating said update quality factor comprises:

comparing each of said correction factors of said second sequential cycle of said electric motor to determine an acceleration of said electric motor; and determining a value for said update quality factor from said acceleration of said electric motor.

8. The method for estimating electric motor speed according to claim 1, wherein calculating said updated correction factor for each of said Hall states of said electric motor comprises:

multiplying a sum of said correction factors for said second sequential cycle of said electric motor by said update quality factor for said second sequential cycle of said electric motor to produce a first product;

multiplying a sum of said correction factors for said first sequential cycle of said electric motor by a sum of update quality factors of previous sequential cycles of said electric motor to produce a second product;

adding said first product to said second product to produce a first sum;

adding said update quality factor for said second sequential cycle of said electric motor to said sum of said update quality factors of previous sequential cycles to produce a second sum; and dividing said first sum by said second sum.

9. The method for estimating electric motor speed according to claim 1, wherein calculating said electric motor speed signal utilizing said updated correction factors for said second sequential cycle of said electric motor comprises:

multiplying one of said correction factors for said second sequential cycle of said electric motor by a number of mechanical degrees traveled by said rotor during said Hall state related to said one of said correction factors for said second sequential cycle of said electric motor to produce a first product; and dividing said first product by a time duration of a Hall state previous to said Hall state related to said one of said correction factors for said second sequential cycle of said electric motor.

10. The method for estimating electric motor speed according to claim 1, wherein said second sequential cycle of said electric motor is one mechanical revolution.

11. The method for estimating electric motor speed according to claim 1, wherein said electric motor is controlled by a cascaded closed-loop controller.

12. The method for estimating electric motor speed according to claim 1, wherein calculating said updated correction factor for each of said Hall states of said electric motor comprises:

incorporating a forgetting factor.

13. The method for estimating electric motor speed according to claim 1, further comprising:

mapping characteristics of said electric motor during end-of-line testing.

14. The method for estimating electric motor speed according to claim 1, wherein said electric motor is coupled with an automobile all-wheel drive disconnect apparatus.

15. A method for estimating electric motor speed, comprising:
providing an electric motor which has completed a first sequential cycle, said electric motor including:
a stator having at least one Hall-effect sensor coupled therewith, wherein said at least one Hall-effect sensor is configured to sense a plurality of Hall states of said electric motor; and
a rotor having a plurality of magnetic poles;
determining whether a second sequential cycle of said electric motor has occurred;
calculating a set of correction factors for said Hall states of said second sequential cycle of said electric motor when said second sequential cycle of said electric motor has occurred, wherein said set of correction factors for said Hall states of said second sequential cycle of said electric motor includes a correction factor for each of said Hall states of said second sequential cycle of said electric motor, and wherein said set of correction factors for said Hall states of said second sequential cycle of said electric motor is a correction vector for said second sequential cycle of said electric motor;
calculating an update quality factor of said correction vector for said second sequential cycle of said electric motor when said second sequential cycle of said electric motor has occurred;
calculating a set of updated correction factors for said Hall states of said second sequential cycle of said electric motor when said second sequential cycle of said electric motor has occurred by utilizing at least one of said update quality factor for said second sequential cycle of said electric motor, said correction vector for said second sequential cycle of said electric motor, and a correction vector for said first sequential cycle of said electric motor, wherein said set of updated correction factors for said Hall states of said second sequential cycle of said electric motor includes an updated correction factor for each of said Hall states of said second sequential cycle of said electric motor, and wherein said set of updated correction factors for said Hall states of said second sequential cycle of said electric motor is an updated correction vector for said second sequential cycle of said electric motor; and
calculating said electric motor speed utilizing said updated correction vector for said second sequential cycle of said electric motor when said second sequential cycle of said electric motor has occurred.

16. The method for estimating electric motor speed according to claim 15, further comprising:
calculating said electric motor speed utilizing said updated correction vector from said first sequential cycle of said electric motor when said second sequential cycle of said electric motor has not occurred.

17. The method for estimating electric motor speed according to claim 15, wherein calculating said update quality factor comprises:
comparing said correction vector of said second sequential cycle of said electric motor to at least one physical constraint of said at least one Hall-effect sensor to determine an offset factor of said correction vector; and
determining a value for said update quality factor from said offset factor.

18. The method for estimating electric motor speed according to claim 15, wherein calculating said update quality factor comprises:
determining a plurality of speed values of said electric motor from a plurality of duty ratios for said electric motor;
determining an acceleration of said electric motor from said speed values of said electric motor; and
determining a value for said update quality factor from said acceleration of said electric motor.

19. The method for estimating electric motor speed according to claim 15, wherein calculating said update quality factor comprises:
comparing each of said correction factors of said correction vector of said second sequential cycle of said electric motor to determine an acceleration of said electric motor; and
determining a value for said update quality factor from said acceleration of said electric motor.

20. A method for estimating electric motor speed, comprising:
providing an electric motor which has completed a first sequential cycle, said electric motor including:
a stator having at least one Hall-effect sensor coupled therewith, wherein said at least one Hall-effect sensor is configured to sense a plurality of Hall states of said electric motor; and
a rotor having a plurality of magnetic poles;
determining whether a second sequential cycle of said electric motor has occurred; and
one of calculating said electric motor speed utilizing said first sequential cycle of said electric motor when said second sequential cycle of said electric motor has not occurred and calculating said electric motor speed utilizing said second sequential cycle of said electric motor when said second sequential cycle of said electric motor has occurred,
wherein said calculating said electric motor speed utilizing said first sequential cycle of said electric motor when said second sequential cycle of said electric motor has not occurred further comprises:
calculating a set of correction factors for said Hall states of said first sequential cycle of said electric motor, wherein said set of correction factors for said Hall states of said first sequential cycle of said electric motor includes a correction factor for each of said Hall states of said first sequential cycle of said electric motor, and wherein said set of correction factors for said Hall states of said electric motor is a correction vector for said first sequential cycle of said electric motor;
calculating an update quality factor of said correction vector for said first sequential cycle of said electric motor;
calculating a set of updated correction factors for said Hall states of said first sequential cycle of said electric motor by utilizing at least one of said update quality factor for said first sequential cycle of said electric motor and said correction vector for said first sequential cycle of said electric motor, wherein said set of updated correction factors for said Hall states of said first sequential cycle of said electric motor includes an updated correction factor for each of said Hall states of said first sequential cycle of said electric motor, and wherein said set of updated correction factors for said Hall states of said first sequential cycle of said electric motor is an updated correction vector for said first sequential cycle of said electric motor; and calculating said electric motor speed utilizing said updated correction vector for said first sequential cycle of said electric motor;

and wherein said calculating said electric motor speed utilizing said second sequential cycle of said electric motor when said second sequential cycle of said electric motor has occurred further comprises:

calculating a set of correction factors for said Hall states of said second sequential cycle of said electric motor, wherein said set of correction factors for said Hall states of said second sequential cycle of said electric motor includes a correction factor for each of said Hall states of said second sequential cycle of said electric motor, and wherein said set of correction factors for said Hall states of said second sequential cycle of said electric motor is a correction vector for said second sequential cycle of said electric motor;

calculating an update quality factor of said correction vector for said second sequential cycle of said electric motor;

calculating a set of updated correction factors for said Hall states of said second sequential cycle of said electric motor by utilizing at least one of said update quality factor for said second sequential cycle of said electric motor, said correction vector for said second sequential cycle of said electric motor, and said correction vector for said first sequential cycle of said electric motor, wherein said set of updated correction factors for said Hall states of said second sequential cycle of said electric motor includes an updated correction factor for each of said Hall states of said second sequential cycle of said electric motor, and wherein said set of updated correction factors for said Hall states of said second sequential cycle of said electric motor is an updated correction vector for said second sequential cycle of said electric motor; and calculating said electric motor speed utilizing said updated correction vector for said second sequential cycle of said electric motor.

\* \* \* \* \*

UNITED STATES PATENT AND TRADEMARK OFFICE
CERTIFICATE OF CORRECTION

PATENT NO.         : 10,298,099 B2
APPLICATION NO.    : 15/444660
DATED              : May 21, 2019
INVENTOR(S)        : Johannes van Ginkel Page 1 of 1

It is certified that error appears in the above-identified patent and that said Letters Patent is hereby corrected as shown below:

In the Claims

Claim 9, Column 8, Line 41, delete the word "signal"

Signed and Sealed this
Nineteenth Day of November, 2019

Andrei Iancu
*Director of the United States Patent and Trademark Office*